(12) United States Patent
Chen et al.

(10) Patent No.: US 11,587,922 B2
(45) Date of Patent: Feb. 21, 2023

(54) PROCESS CONTROL FOR PACKAGE FORMATION

(71) Applicant: Taiwan Semiconductor Manufacturing Co., Ltd., Hsinchu (TW)

(72) Inventors: Ming-Fa Chen, Taichung (TW); Hsien-Wei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 88 days.

(21) Appl. No.: 17/026,900

(22) Filed: Sep. 21, 2020

(65) Prior Publication Data

US 2021/0005595 A1    Jan. 7, 2021

Related U.S. Application Data

(62) Division of application No. 16/121,861, filed on Sep. 5, 2018, now Pat. No. 10,784,247.

(Continued)

(51) Int. Cl.
*H01L 25/00* (2006.01)
*H01L 23/00* (2006.01)
(Continued)

(52) U.S. Cl.
CPC .............. *H01L 25/50* (2013.01); *H01L 21/56* (2013.01); *H01L 21/76898* (2013.01); *H01L 23/3114* (2013.01); *H01L 23/3128* (2013.01); *H01L 23/481* (2013.01); *H01L 23/5383* (2013.01); *H01L 24/09* (2013.01); *H01L 24/14* (2013.01); *H01L 24/19* (2013.01); *H01L 24/89* (2013.01);
(Continued)

(58) Field of Classification Search
None
See application file for complete search history.

(56) References Cited

U.S. PATENT DOCUMENTS 9,520,385 B1    12/2016   Chen et al.
9,524,959 B1    12/2016   Veh et al.
(Continued)

FOREIGN PATENT DOCUMENTS

CN    101192533 B    6/2010
CN    106298716 A    1/2017
(Continued)

*Primary Examiner* — Long Pham
(74) *Attorney, Agent, or Firm* — Slater Matsil, LLP

(57) ABSTRACT

A method includes bonding a first and a second device die to a third device die, forming a plurality of gap-filling layers extending between the first and the second device dies, and performing a first etching process to etch a first dielectric layer in the plurality of gap-filling layers to form an opening. A first etch stop layer in the plurality of gap-filling layers is used to stop the first etching process. The opening is then extended through the first etch stop layer. A second etching process is performed to extend the opening through a second dielectric layer underlying the first etch stop layer. The second etching process stops on a second etch stop layer in the plurality of gap-filling layers. The method further includes extending the opening through the second etch stop layer, and filling the opening with a conductive material to form a through-via.

20 Claims, 17 Drawing Sheets

Related U.S. Application Data

(60) Provisional application No. 62/586,305, filed on Nov. 15, 2017.

(51) Int. Cl.
| | | |
|---|---|---|
| *H01L 23/538* | (2006.01) | |
| *H01L 23/48* | (2006.01) | |
| *H01L 21/768* | (2006.01) | |
| *H01L 23/31* | (2006.01) | |
| *H01L 25/03* | (2006.01) | |
| *H01L 21/56* | (2006.01) | |
| *H01L 25/10* | (2006.01) | |
| *H01L 25/18* | (2023.01) | |
| *H01L 25/065* | (2023.01) | |

(52) U.S. Cl.
CPC ............ *H01L 25/03* (2013.01); *H01L 25/105* (2013.01); *H01L 23/5389* (2013.01); *H01L 25/0657* (2013.01); *H01L 25/18* (2013.01); *H01L 2224/02331* (2013.01); *H01L 2224/02379* (2013.01); *H01L 2224/04105* (2013.01); *H01L 2224/08145* (2013.01); *H01L 2224/12105* (2013.01); *H01L 2224/16227* (2013.01); *H01L 2224/32145* (2013.01); *H01L 2224/32225* (2013.01); *H01L 2224/73265* (2013.01); *H01L 2224/94* (2013.01); *H01L 2225/0651* (2013.01); *H01L 2225/06541* (2013.01); *H01L 2225/06568* (2013.01); *H01L 2225/1035* (2013.01); *H01L 2225/1058* (2013.01); *H01L 2924/15311* (2013.01); *H01L 2924/3511* (2013.01)

(56) References Cited

U.S. PATENT DOCUMENTS

| | | |
|---|---|---|
| 9,768,133 B1 | 9/2017 | Wu et al. |
| 9,899,355 B2 | 2/2018 | Yuan et al. |
| 2015/0318246 A1 | 11/2015 | Yu et al. |
| 2016/0197029 A1 | 7/2016 | Tsai et al. |
| 2017/0005027 A1 | 1/2017 | Yu et al. |
| 2017/0040237 A1* | 2/2017 | Shen ................. H01L 23/49838 |
| 2017/0125376 A1 | 5/2017 | Yeh et al. |

FOREIGN PATENT DOCUMENTS

| | | |
|---|---|---|
| CN | 106558577 A | 4/2017 |
| CN | 107017171 A | 8/2017 |

* cited by examiner

US 11,587,922 B2

PROCESS CONTROL FOR PACKAGE FORMATION

PRIORITY CLAIM AND CROSS-REFERENCE

This application is a divisional of U.S. patent application Ser. No. 16/121,861, entitled "Process Control for Package Formation," and filed Sep. 5, 2018, which claims the benefit of the U.S. Provisional Application No. 62/586,305, filed Nov. 15, 2017, and entitled "Process Control for SoIC Formation," which applications are hereby incorporated herein by reference.

BACKGROUND

The packages of integrated circuits are becoming increasing complex, with more device dies packaged in the same package to achieve more functions. For example, a package structure has been developed to include a plurality of device dies such as processors and memory cubes in the same package. The package structure can bond device dies, which are formed using different technologies and have different functions, to the same device die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
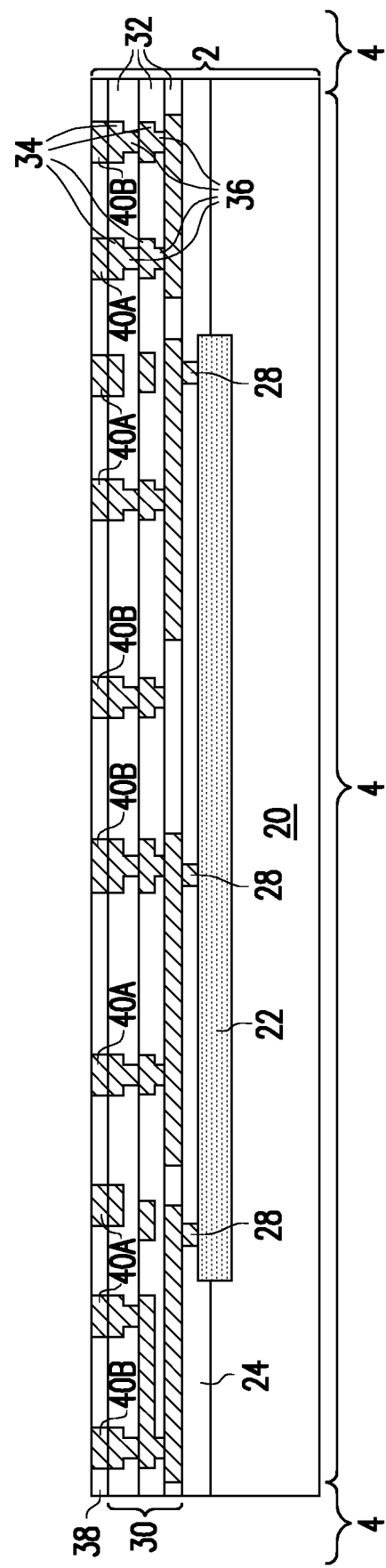
FIGS. 1 through 13 are cross-sectional views of intermediate stages in the manufacturing of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various exemplary embodiments. The intermediate stages of forming the package are illustrated in accordance with some embodiments. Some variations of some embodiments are discussed. Throughout the various views and illustrative embodiments, like reference numbers are used to designate like elements.

Figure 17:
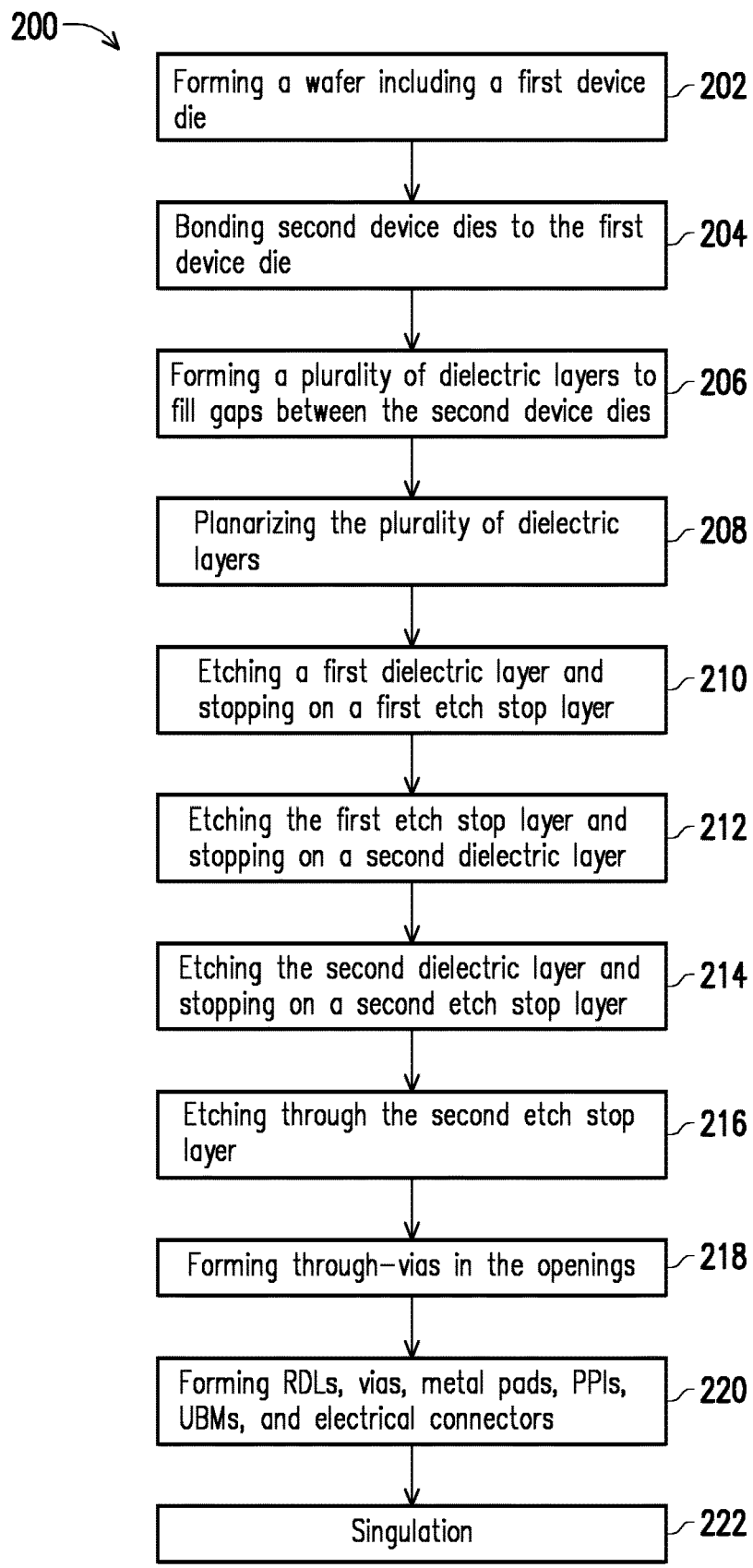
FIG. 17 illustrates a process flow for forming a package structure in accordance with some embodiments.

FIGS. 1 through 13 illustrate the cross-sectional views of intermediate stages in the formation of a package in accordance with some embodiments of the present disclosure. The steps shown in FIGS. 1 through 13 are also reflected schematically in the process flow 200 shown in FIG. 17.

FIG. 1 illustrates the cross-sectional view in the formation of wafer 2. The respective process is illustrated as process 202 in the process flow shown in FIG. 17. In accordance with some embodiments of the present disclosure, wafer 2 is a device wafer including active devices such as transistors and/or diodes, and possibly passive devices such as capacitors, inductors, resistors, or the like. Device wafer 2 may include a plurality of chips 4 therein, with one of chips 4 illustrated. Chips 4 are alternatively referred to as (device) dies hereinafter. In accordance with some embodiments of the present disclosure, device die 4 is a logic die, which may be a Central Processing Unit (CPU) die, a Micro Control Unit (MCU) die, an input-output (I/O) die, a BaseBand (BB) die, or an Application processor (AP) die. Device die 4 may also be a memory die such as a Dynamic Random Access Memory (DRAM) die or a Static Random Access Memory (SRAM) die.

In accordance with alternative embodiments of the present disclosure, package component 2 includes passive devices (with no active devices). In subsequent discussion, a device wafer is discussed as an exemplary package component 2. The embodiments of the present disclosure may also be applied to other types of package components such as interposer wafers.

In accordance with some embodiments of the present disclosure, the exemplary wafer 2 includes semiconductor substrate 20 and the features formed at a top surface of semiconductor substrate 20. Semiconductor substrate 20 may be formed of crystalline silicon, crystalline germanium, crystalline silicon germanium, and/or a III-V compound semiconductor such as GaAsP, AlInAs, AlGaAs, GaInAs, GaInP, GaInAsP, and the like. Semiconductor substrate 20 may also be a bulk silicon substrate or a Silicon-On-Insulator (SOI) substrate. Shallow Trench Isolation (STI) regions (not shown) may be formed in semiconductor substrate 20 to isolate the active regions in semiconductor substrate 20. Although not shown, through-vias may be formed to extend into semiconductor substrate 20, wherein the through-vias are used to electrically inter-couple the features on opposite sides of wafer 2.

In accordance with some embodiments of the present disclosure, wafer 2 includes integrated circuit devices 22, which are formed on the top surface of semiconductor substrate 20. Exemplary integrated circuit devices 22 may include Complementary Metal-Oxide Semiconductor (CMOS) transistors, resistors, capacitors, diodes, and/or the like. The details of integrated circuit devices 22 are not illustrated herein. In accordance with alternative embodiments, wafer 2 is used for forming interposers, in which substrate 20 may be a semiconductor substrate or a dielectric substrate.

Inter-Layer Dielectric (ILD) 24 is formed over semiconductor substrate 20 and fills the space between the gate stacks of transistors (not shown) in integrated circuit devices 22. In accordance with some exemplary embodiments, ILD 24 is formed of Phospho Silicate Glass (PSG), Boro Silicate Glass (BSG), Boron-Doped Phospho Silicate Glass (BPSG), Fluorine-Doped Silicate Glass (FSG), Tetra Ethyl Ortho Silicate (TEOS), or the like. ILD 24 may be formed using spin coating, Flowable Chemical Vapor Deposition (FCVD), Chemical Vapor Deposition (CVD), or the like. In accordance with some embodiments of the present disclosure, ILD 24 is formed using a deposition method such as Plasma Enhanced Chemical Vapor Deposition (PECVD), Low Pressure Chemical Vapor Deposition (LPCVD), or the like.

Contact plugs 28 are formed in ILD 24, and are used to electrically connect integrated circuit devices 22 to overlying metal lines and vias. In accordance with some embodiments of the present disclosure, contact plugs 28 are formed of a conductive material selected from tungsten, aluminum, copper, titanium, tantalum, titanium nitride, tantalum nitride, alloys therefore, and/or multi-layers thereof. The formation of contact plugs 28 may include forming contact openings in ILD 24, filling a conductive material(s) into the contact openings, and performing a planarization (such as Chemical Mechanical Polish (CMP) process) to level the top surfaces of contact plugs 28 with the top surface of ILD 24.

Over ILD 24 and contact plugs 28 resides interconnect structure 30. Interconnect structure 30 includes metal lines 34 and vias 36, which are formed in dielectric layers 32. Dielectric layers 32 are alternatively referred to as Inter-Metal Dielectric (IMD) layers 32 hereinafter. In accordance with some embodiments of the present disclosure, at least the lower ones of dielectric layers 32 are formed of a low-k dielectric material having a dielectric constant (k-value) lower than about 3.0, about 2.5, or even lower. Dielectric layers 32 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 32 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of dielectric layers 32 includes depositing a porogen-containing dielectric material, and then performing a curing process to drive out the porogen, and hence the remaining dielectric layers 32 is porous. Etch stop layers (not shown), which may be formed of silicon carbide, silicon nitride, or the like, are formed between IMD layers 32, and are not shown for simplicity.

Metal lines 34 and vias 36 are formed in dielectric layers 32. The metal lines 34 at a same level are collectively referred to as a metal layer hereinafter. In accordance with some embodiments of the present disclosure, interconnect structure 30 includes a plurality of metal layers that are interconnected through vias 36. Metal lines 34 and vias 36 may be formed of copper or copper alloys, and they can also be formed of other metals. The formation process may include single damascene and dual damascene processes. In an exemplary single damascene process, a trench is first formed in one of dielectric layers 32, followed by filling the trench with a conductive material. A planarization process such as a CMP process is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. The conductive material may include a diffusion barrier layer and a copper-containing metallic material over the diffusion barrier layer. The diffusion barrier layer may include titanium, titanium nitride, tantalum, tantalum nitride, or the like.

FIG. 1 illustrates surface dielectric layer 38 in accordance with some embodiments of the present disclosure. Surface dielectric layer 38 is formed of a non-low-k dielectric material such as silicon oxide. Surface dielectric layer 38 is alternatively referred to as a passivation layer since it has the function of isolating the underlying low-k dielectric layers (if any) from the adverse effect of detrimental chemicals and moisture. Surface dielectric layer 38 may also have a composite structure including more than one layer, which may be formed of silicon oxide, silicon nitride, Undoped Silicate Glass (USG), or the like. Device die 4 may also include metal pads such as aluminum or aluminum copper pads, Post-Passivation Interconnect (PPI), or the like, which are not shown for simplicity.

Bond pads 40A and 40B, which are also collectively or individually referred to bond pads 40, are formed in surface dielectric layer 38. In accordance with some embodiments of the present disclosure, bond pads 40A and 40B are formed through a single damascene process, and may also include barrier layers and a copper-containing material formed over the barrier layers. In accordance with alternative embodiments of the present disclosure, bond pads 40A and 40B may be formed through a dual damascene process.

In accordance with some embodiments of the present disclosure, there is no organic dielectric material such as polymer layer in wafer 2. Organic dielectric layers typically have high Coefficients of Thermal Expansion (CTEs), such as 10 ppm/C° or higher. This is significantly greater than the CTE of silicon substrate (such as substrate 20), which is about 3 ppm/C°. Accordingly, organic dielectric layers tend to cause the warpage of wafer 2. Not including organic materials in wafer 2 advantageously reduces the CTE mismatch between the layers in wafer 2, and results in the reduction in warpage. Also, not including organic materials in wafer 2 makes the formation of fine-pitch metal lines (such as 72 in FIG. 10) and high-density bond pads possible, and results in the improvement in the routing ability.

The top surface dielectric layer 38 and bond pads 40 are planarized so that their top surfaces are coplanar, which may be resulted due to the CMP in the formation of bond pads 40.

Figure 2:
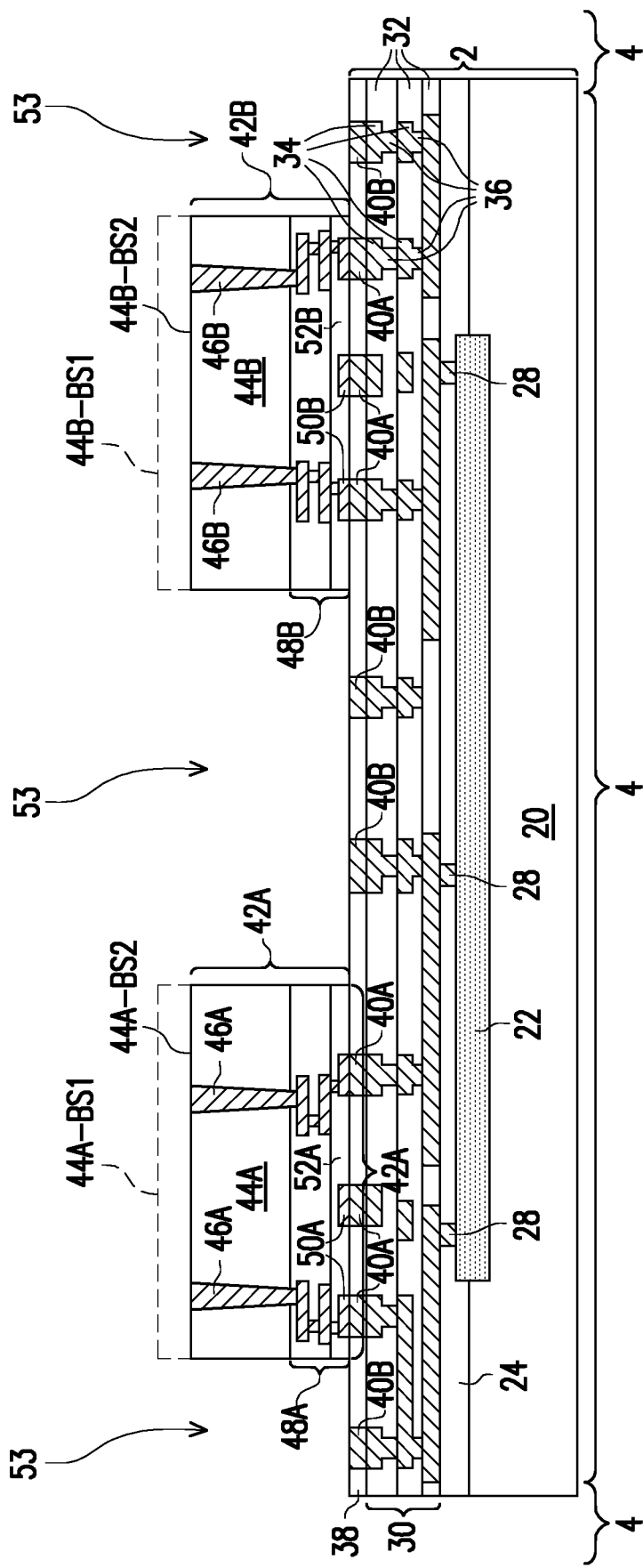

Next, device dies 42A and 42B are bonded to wafer 2, as shown in FIG. 2. The respective process is illustrated as process 204 in the process flow shown in FIG. 17. In accordance with some embodiments of the present disclosure, each of device dies 42A and 42B may be a logic die, which may be a CPU die, a MCU die, an IO die, a BaseBand die, or an AP die. Device dies 42A and 42B may include memory dies. Device dies 42A and 42B may be different types of dies selected from the above-listed types. Furthermore, device dies 42A and 42B may be formed using different technologies such as 45 nm technology, 28 nm technology, 20 nm technology, or the like. Also, one of device dies 42A and 42B may be a digital circuit die, while the other may be an analog circuit die. Dies 4, 42A, and 42B in combination function as a system. Splitting the functions and circuits of a system into different dies such as dies 4, 42A, and 42B may optimize the formation of these dies, and may result in the reduction of manufacturing cost.

Device dies 42A and 42B include semiconductor substrates 44A and 44B, respectively, which may be silicon substrates. Through-Silicon Vias (TSVs) 46A and 46B, sometimes referred to as through-semiconductor vias or through-vias, are formed to penetrate through semiconductor substrates 44A and 44B, respectively. TSVs 46A and 46B are used to connect the devices and metal lines formed on the front side (the illustrated bottom side) of semiconductor substrates 44A and 44B to the backside. Also, device dies 42A and 42B include interconnect structures 48A and 48B, respectively, for connecting to the active devices and passive devices in device dies 42A and 42B. Interconnect structures 48A and 48B include metal lines and vias (not shown).

Device die 42A includes bond pads 50A and dielectric layer 52A at the illustrated bottom surface of device die 42A. The bottom surfaces of bond pads 50A are coplanar with the bottom surface of dielectric layer 52A. Device die 42B includes bond pads 50B and dielectric layer 52B at the illustrated bottom surface. The bottom surfaces of bond pads 50B are coplanar with the bottom surface of dielectric layer 52B. In accordance with some embodiments of the present disclosure, all device dies such as dies 42A and 42B are free from organic dielectric materials such as polymers.

The bonding may be achieved through hybrid bonding. For example, bond pads 50A and 50B are bonded to bond pads 40A through metal-to-metal direct bonding. In accordance with some embodiments of the present disclosure, the metal-to-metal direct bonding is copper-to-copper direct bonding. Furthermore, dielectric layers 52A and 52B are bonded to surface dielectric layer 38, for example, with Si—O—Si bonds generated.

To achieve the hybrid bonding, device dies 42A and 42B are first pre-bonded to dielectric layer 38 and bond pads 40A by lightly pressing device dies 42A and 42B against die 4. Although two device dies 42A and 42B are illustrated, the hybrid bonding may be performed at wafer level, and a plurality of device die groups identical to the illustrated die group including device dies 42A and 42B is pre-bonded, and arranged as rows and columns.

After all device dies 42A and 42B are pre-bonded, an anneal is performed to cause the inter-diffusion of the metals in bond pads 40A and the corresponding overlying bond pads 50A and 50B. The annealing temperature may be in the range between about 200° and about 400° C., and may be in the range between about 300° and about 400° C. in accordance with some embodiments. The annealing time may be in the range between about 1.5 hours and about 3.0 hours, and may be in the range between about 1.5 hours and about 2.5 hours in accordance with some embodiments. Through the hybrid bonding, bond pads 50A and 50B are bonded to the corresponding bond pads 40A through direct metal bonding caused by metal inter-diffusion. Bond pads 50A and 50B may form distinguishable interfaces with the corresponding bond pads 40A.

Dielectric layer 38 is also bonded to dielectric layers 52A and 52B, with bonds formed therebetween. For example, the atoms (such as oxygen atoms) in one of the dielectric layers 38 and 52A/52B form chemical or covalence bonds with the atoms (such as silicon atoms) in the other one of dielectric layers 38 and 52A/52B. The resulting bonds between dielectric layers 38 and 52A/52B are dielectric-to-dielectric bonds. Bond pads 50A and 50B may have sizes greater than, equal to, or smaller than, the sizes of the respective bond pads 40A. Gaps 53 are left between neighboring device dies 42A and 42B.

Further referring to FIG. 2, a backside grinding may be performed to thin device dies 42A and 42B, for example, to a thickness between about 15 μm and about 30 μm. FIG. 2 schematically illustrates dashed lines 44A-BS1 and 44B-BS1, which are the back surfaces of device dies 42A and 42B, respectively before the backside grinding. 44A-BS2 and 44B-BS2 are the back surfaces of device dies 42A and 42B, respectively after the backside grinding. Through the thinning of device dies 42A and 42B, the aspect ratio of gaps 53 between neighboring device dies 42A and 42B is reduced in order to perform gap filling. Otherwise, the gap filling may be difficult due to the otherwise high aspect ratio of gaps 53. After the backside grinding, TSVs 46A and 46B may be revealed. Alternatively, TSVs 46A and 46B are not revealed at this time, and the backside grinding is stopped when there is a thin layer of substrate covering TSVs 46A and 46B. In accordance with these embodiments, TSVs 46A and 46B may be revealed in the step shown in FIG. 4. In accordance with other embodiments in which the aspect ratio of gaps 53 is not too high for gap filling, the backside grinding is skipped.

Figure 3:
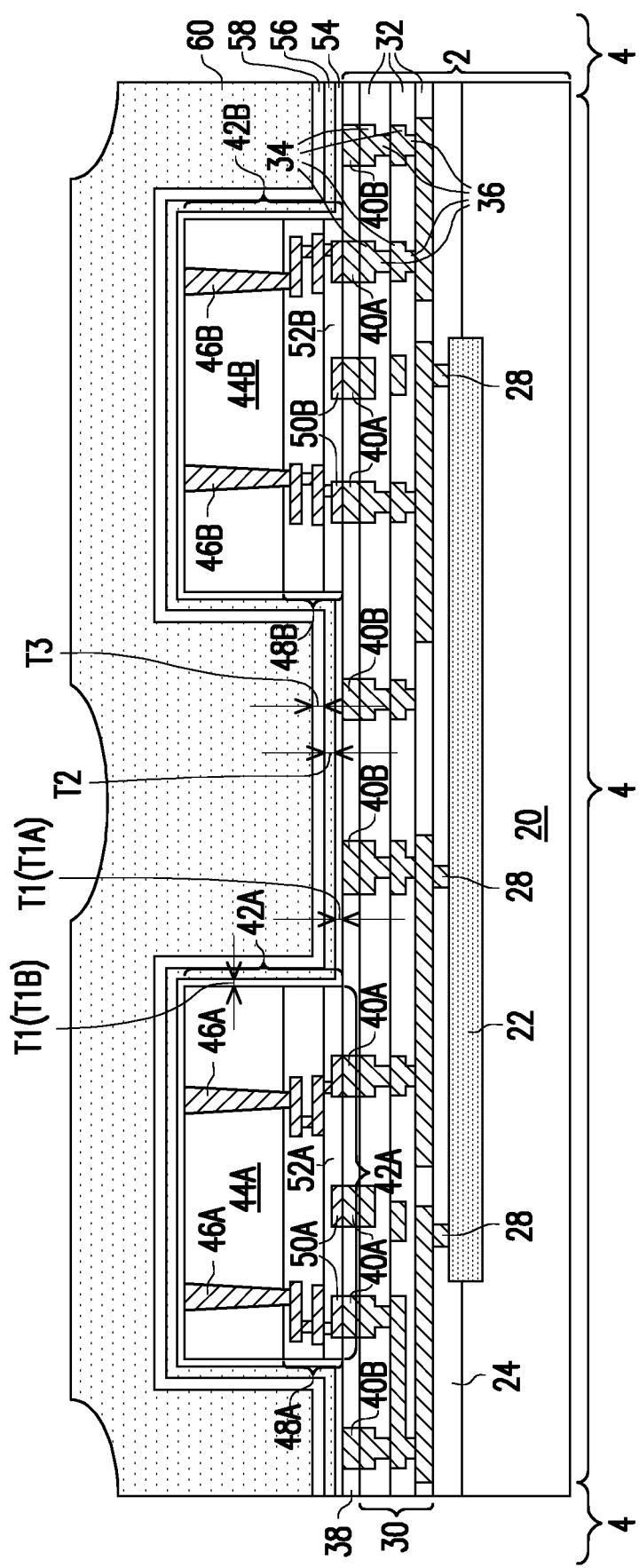

FIG. 3 illustrates the formation of a plurality of gap-filling layers, which includes dielectric layers and the underlying etch stop layers. The respective process is illustrated as process 206 in the process flow shown in FIG. 17. In accordance with some embodiments of the present disclosure, the gap-filling layers includes etch stop layer 54, dielectric layer 56 over and contacting etch stop layer 54, etch stop layer 58 over and contacting dielectric layer 56, and dielectric layer 60 over and contacting etch stop layer 58. Layers 54, 56, and 58 may be deposited sequentially, and may be deposited using conformal deposition methods such as Atomic Layer Deposition (ALD) or Chemical Vapor Deposition (CVD).

Etch stop layer 54 is formed of a dielectric material that has a good adhesion to the sidewalls of device dies 42A and 42B and the top surfaces of dielectric layer 38 and bond pads 40B. In accordance with some embodiments of the present disclosure, etch stop layer 54 is formed of a nitride-containing material such as silicon nitride. The thickness T1 (including T1A and T1B) of etch stop layer 54 may be in the range between about 500 Å and about 1,000 Å. It is appreciated that the values recited throughout the description are examples, and different values may be used. Etch stop layer 54 extends on, and contacts, the sidewalls of device dies 42A and 42B. Etch stop layer 54 may be a conformal layer, for example, with the thickness T1A of horizontal portions and thickness T1B of the vertical portions being substantially equal to each other, for example, with the difference (T1A-T1B) having an absolute value smaller than about 20 percent, or smaller than about 10 percent, of both thicknesses T1A and T1B.

Dielectric layer 56 is formed of a material different from the material of etch stop layer 54. In accordance with some embodiments of the present disclosure, dielectric layer 56 is formed of silicon oxide, which may be formed of TEOS, while other dielectric materials such as silicon carbide, silicon oxynitride, silicon oxy-carbo-nitride, or the like may also be used when there is an adequate etching selectivity (for example, higher than about 50) between dielectric layer 56 and etch stop layer 54. The etching electivity is the ratio of the etching rate of dielectric layer 56 to the etching rate of etch stop layer 54 when etching dielectric layer 56 in a subsequent process. The thickness T2 of dielectric layer 56 may be in the range between about 15 kÅ (1.5 µm) and about 25 kÅ (2.5 µm). Dielectric layer 56 may also be a conformal layer, with the thicknesses of the horizontal portions and vertical portions being substantially equal to each other.

Etch stop layer 58 is formed of a material different from the material of dielectric layer 56. The materials of etch stop layer 58 and etch stop layer 54 may be the same as each other or different from each other. In accordance with some embodiments of the present disclosure, etch stop layer 58 is formed of silicon nitride, silicon oxide, silicon carbide, silicon oxynitride, silicon oxy-carbo-nitride, or the like. The thickness T3 of etch stop layer 58 may be in the range between about 3 kÅ and about 5 kÅ. Etch stop layer 58 may also be a conformal layer, with the thicknesses of the horizontal portions and vertical portions being substantially equal to each other. Thickness T3 of dielectric layer 56 may also be greater than, equal to, or smaller than the thickness T1 of etch stop layer 54, depending on whether thickness T4 (FIG. 4) is greater than, equal to, or smaller than, respectively, thickness T1. In accordance with some embodiments of the present disclosure, since thickness T2 is smaller than thickness T4 (FIG. 4), and the etching of openings 66 has been synchronized on etch stop layer 58, the thickness T1 of etch stop layer 54 may be smaller than thickness T3 of etch stop layer 58 without sacrificing the etch-stop ability of etch stop layer 54.

Dielectric layer 60 is formed of a material different from the material of etch stop layer 58. In accordance with some embodiments of the present disclosure, dielectric layer 60 is formed of silicon oxide, which may be formed of TEOS, while other dielectric material such as silicon carbide, silicon oxynitride, silicon oxy-carbo-nitride, PSG, BSG, BPSG, or the like may also be used when there is an adequate etching selectivity (for example, higher than about 50) between dielectric layer 60 and etch stop layer 58. The etching electivity is the ratio of the etching rate of dielectric layer 60 to the etching rate of etch stop layer 58 when etching dielectric layer 60 in subsequent process. Dielectric layer 60 may be formed using CVD, High-Density Plasma Chemical Vapor Deposition (HDPCVD), Flowable Chemical Vapor Deposition (CVD), spin-on coating, or the like. Dielectric layer 60 fully fills the remaining gaps 53 (FIG. 2), and no seam and void are generated in dielectric layer 60.

Figure 4:
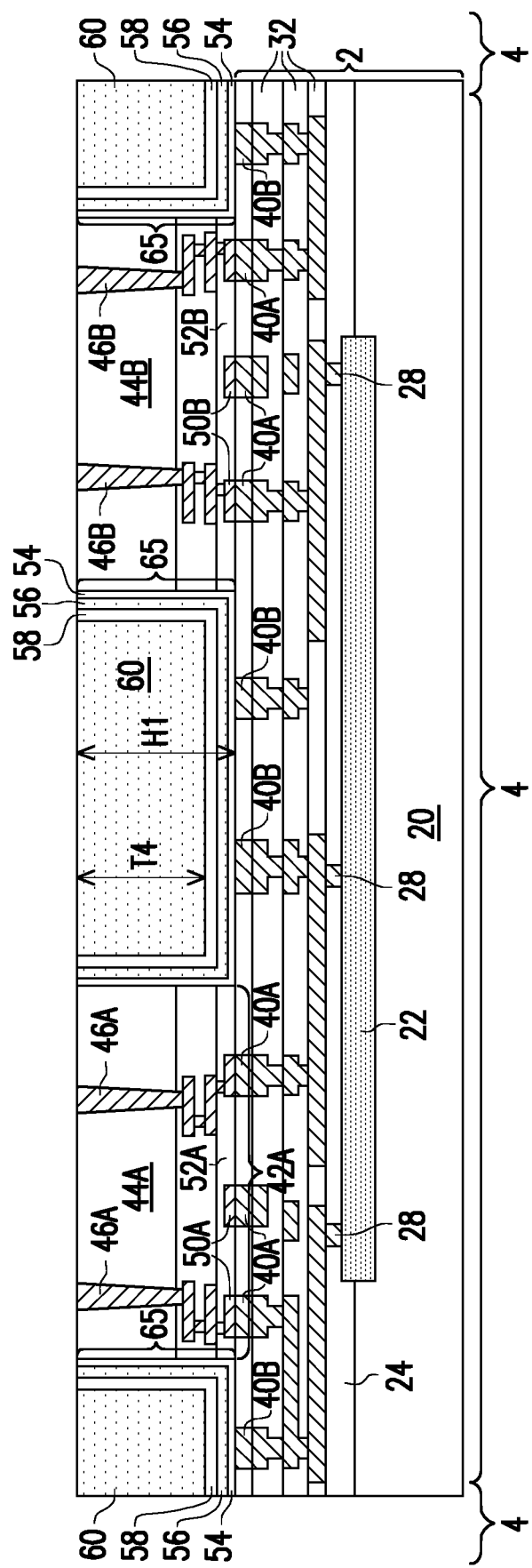

Referring to FIG. 4, a planarization process such as a CMP process or a mechanical grinding process is performed to remove excess portions of gap-filling layers 60, 58, 56, and 54, so that device dies 42A and 42B are exposed. The respective process is illustrated as process 208 in the process flow shown in FIG. 17. Also, through-vias 46A and 46B are exposed. The remaining portions of layers 54, 56, 58, and 60 are collectively referred to as (gap-filling) isolation regions 65. The resulting thickness T4 of dielectric layer 60 may be in the range between about 60 percent and about 90 percent of height H1 of isolation regions 65. In accordance with some embodiments of the present disclosure, height H1 of isolation regions 65 is greater than about 18 µm, and may be in the range between about 20 µm and about 30 µm.

Figure 5:
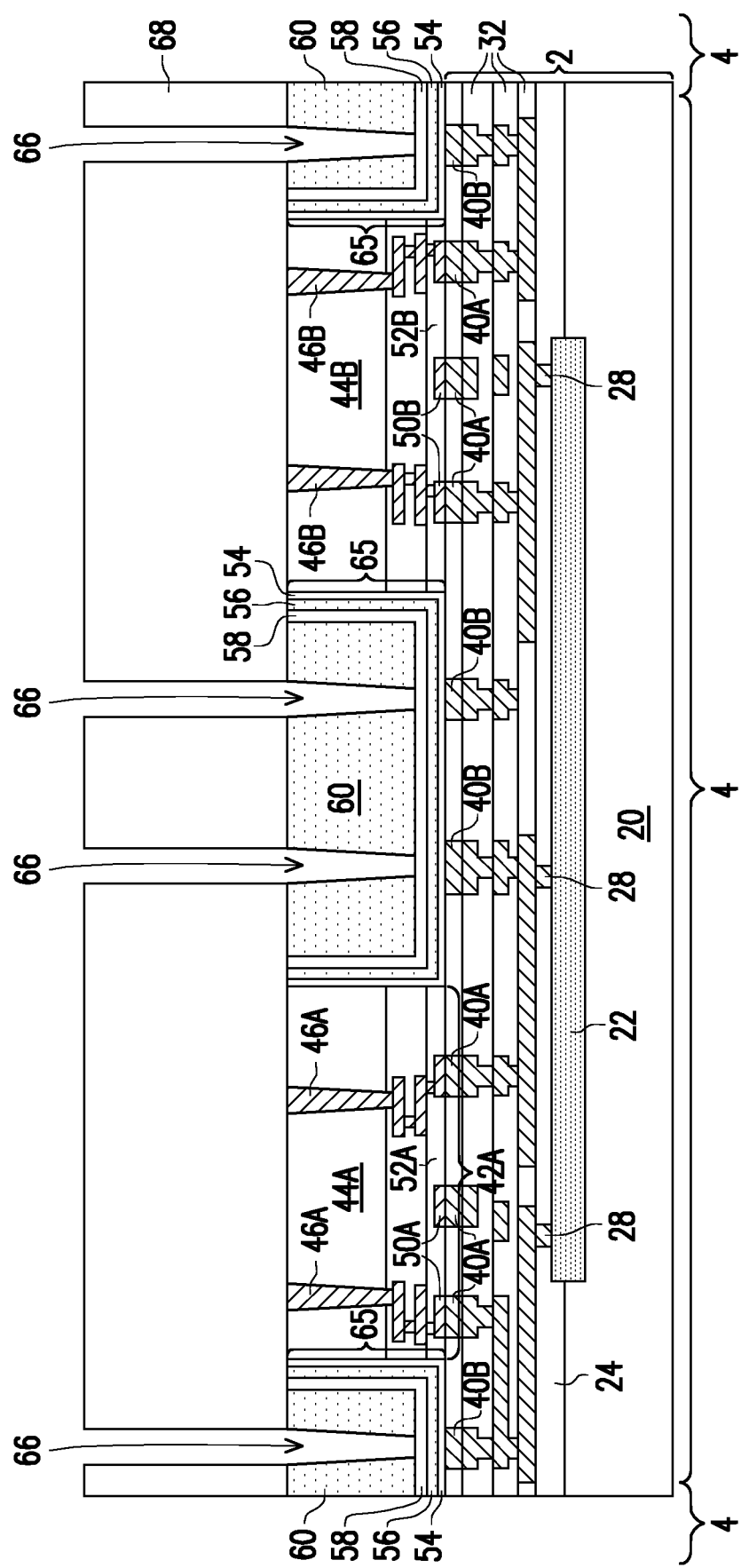

FIG. 5 illustrates the etching of dielectric layer 60 to form openings 66. The respective process is illustrated as process 210 in the process flow shown in FIG. 17. In accordance with some embodiments of the present disclosure, photo resist 68 is formed and patterned, and dielectric layer 60 is etched using the patterned photo resist 68 as an etching mask. Openings 66 are thus formed, and extend down to etch stop layer 58, which acts as the etch stop layer. In accordance with some embodiments of the present disclosure, dielectric layer 60 comprises an oxide, and the etching may be performed through dry etching. The etching gas may include a mixture of $NF_3$ and $NH_3$, or a mixture of HF and $NH_3$. Using etch top layer 58 to stop the etching for forming openings 66 allows the downward proceeding of multiple openings 66 on the same wafer 2 to be synchronized at the same intermediate level, so that the faster-etched openings will wait for the slower-etched openings before they extend downwardly again.

It is appreciated that wafer 2 has warpage, which may be significant enough to cause different openings 66 to extend to different levels. When thickness height H1 of isolation regions is greater than certain value (which is affected by various factors such as the technology and the material of isolation regions 65), the etching for forming openings 66 experiences problem if a single dielectric layer and a single etch stop layer are formed, and some openings may reach the etch stop layer, while some other openings will not be able to reach the etch stop layer. As a result, a via-opening problem is resulted since the vias formed in the openings that fail to reach and penetrate through the single etch stop layer will form an open circuit. This problem cannot be solved by increasing over-etch time since it will lead to other problems. In accordance with some embodiments of the present disclosure, two etch stop layers 54 and 58 and two dielectric layers 56 and 60 are formed, so that the thickness T4 of dielectric layer 60 is smaller than height H1. Thickness T4 is selected so that the etching of dielectric layer 60 falls within the corresponding process window, and all openings 66 are able to reach and stop on etch stop layer 58.

Figure 6:
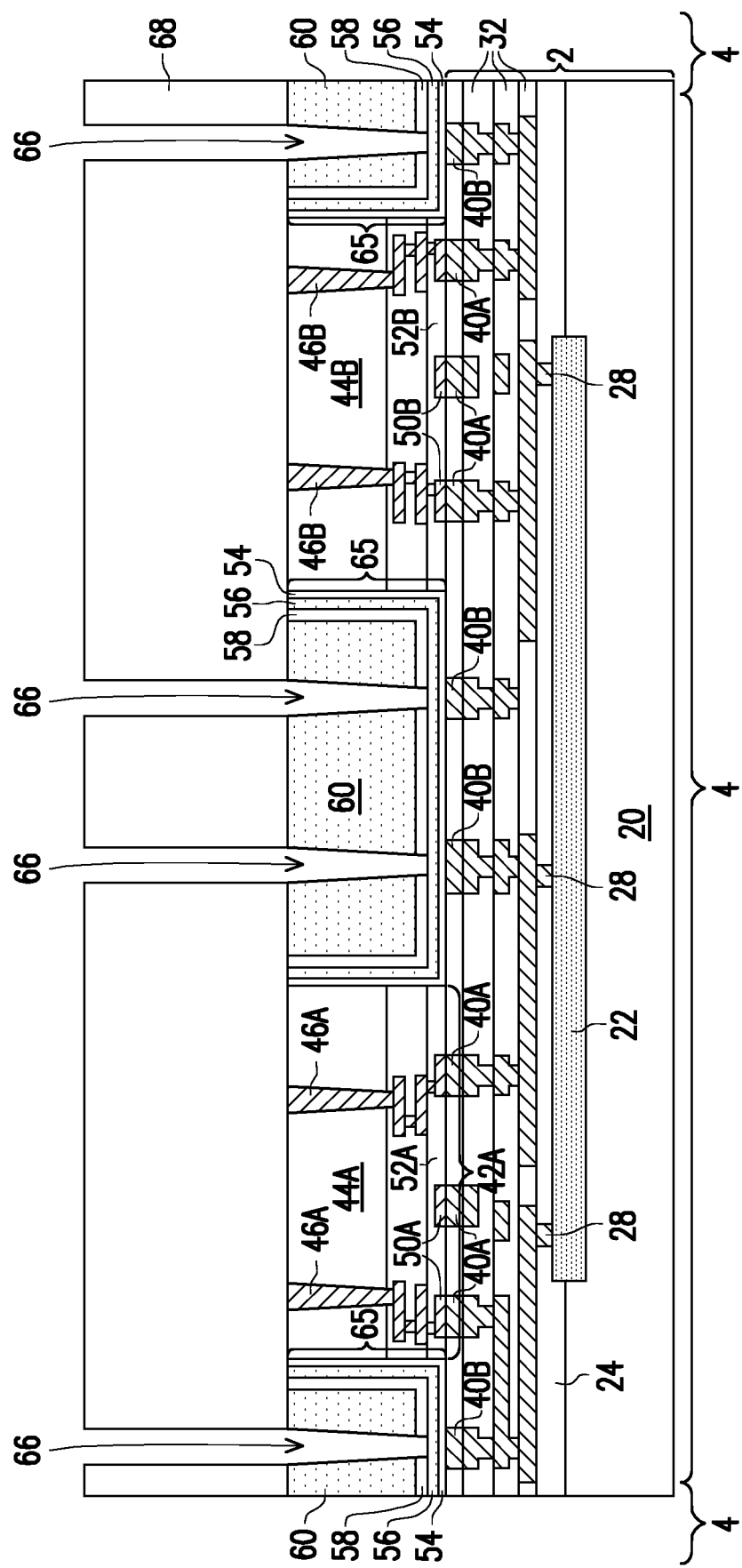

Referring to FIG. 6, etch stop layer 58 is etched, so that openings 66 extend down to dielectric layer 56. The respective process is illustrated as process 212 in the process flow shown in FIG. 17. In accordance with some embodiments of the present disclosure, etch stop layer 58 comprises silicon nitride, and the etching is performed using dry etching. The etching gas may include a mixture of $CF_4$, $O_2$, and $N_2$, a mixture of $NF_3$ and $O_2$, $SF_6$, or a mixture of $SF_6$ and $O_2$. There is also a high etching selectivity between etch stop layer 58 and dielectric layer 56, and hence the etching stops on dielectric layer 56, which also acts as an etch stop layer for etching layer 58.

Figure 7:
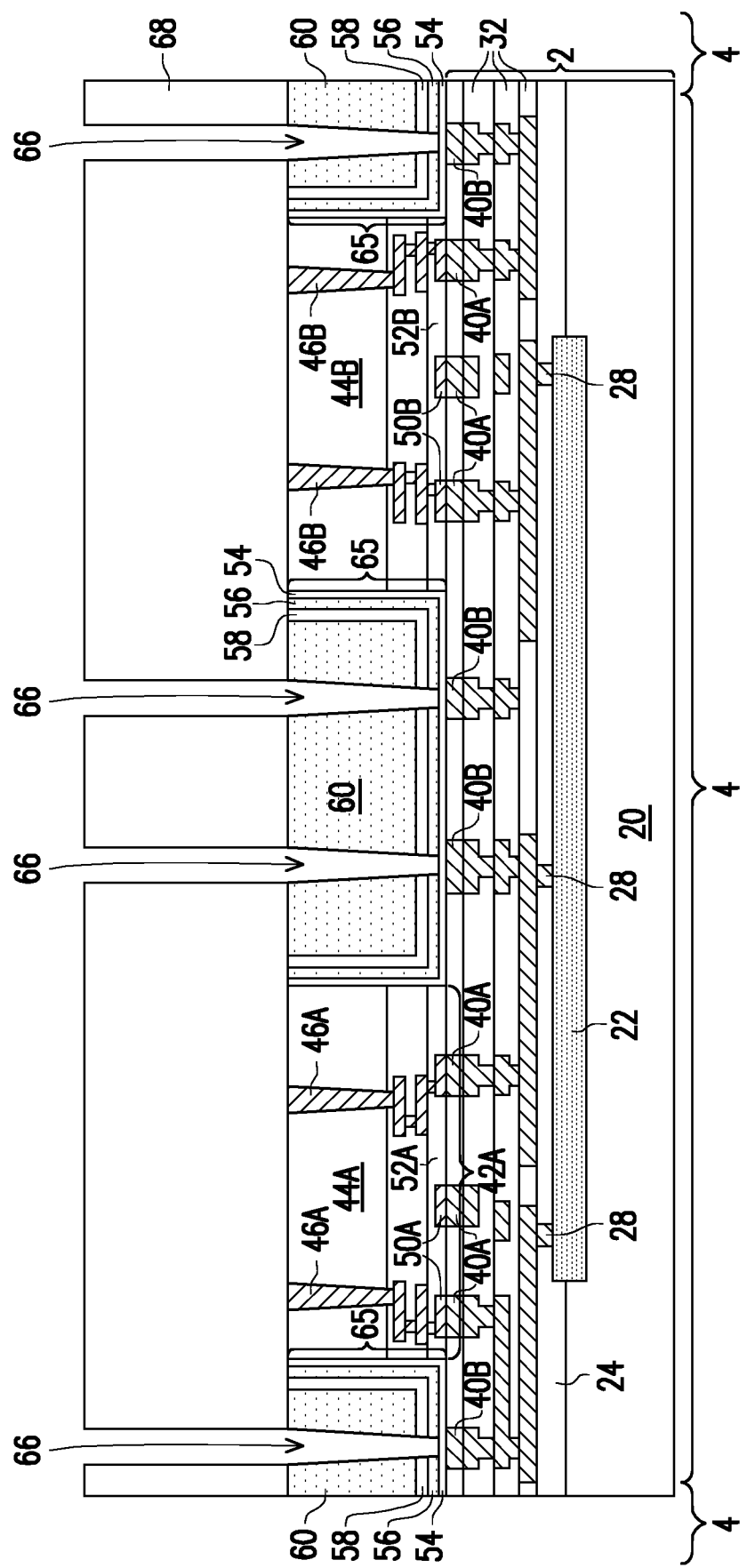

FIG. 7 illustrates the etching of dielectric layer 56 to further extend openings 66 down to etch stop layer 54, which acts as the etch stop layer for the etching of dielectric layer 56. The respective process is illustrated as process 214 in the process flow shown in FIG. 17. In accordance with some embodiments of the present disclosure, dielectric layer 60 comprises an oxide. The etching may be performed through dry etching. The etching gas may include a mixture of $NF_3$ and $NH_3$, or a mixture of HF and $NH_3$.

Figure 8:
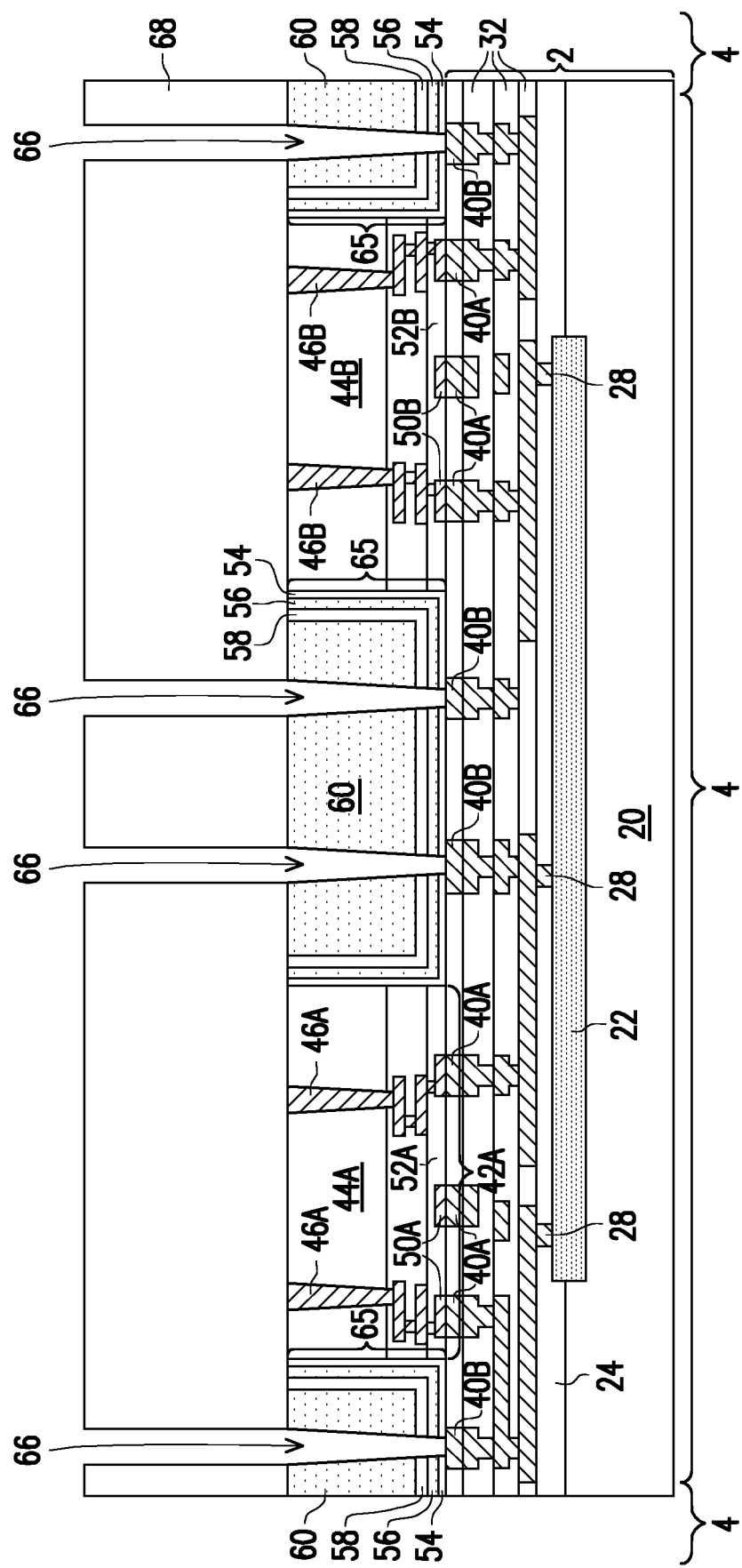

Referring to FIG. 8, etch stop layer 54 is further etched, so that openings 66 extend down to bond pads 40B, which are exposed to openings 66. The respective process is illustrated as process 216 in the process flow shown in FIG. 17. The etching process may also be a dry etching process. In accordance with some embodiments of the present disclosure, etch stop layer 54 is formed of silicon nitride, and the etching is performed using dry etching. The etching gas may include a mixture of $CF_4$, $O_2$, and $N_2$, a mixture of $NF_3$ and $O_2$, $SF_6$, or a mixture of $SF_6$ and $O_2$. Photo resist 68 is then removed.

In accordance with alternative embodiments of the present disclosure, layers 56 and 54 are etched in a common etching process using the same etching gas(es), with the etching gas being selected to etch both layers 56 and 54, and the etching selectivity between layer 56 and etch stop layer 54 being relatively smaller, for example, in the range between about 2 and about 10, or in the range between about 5 and 10. Accordingly, although the etching rate of layer 54 is relatively small, when layer 54 is thinner than the overlaying layers, layer 54 may still be etched using the same etching gas for etching layer 56.

Figure 9:
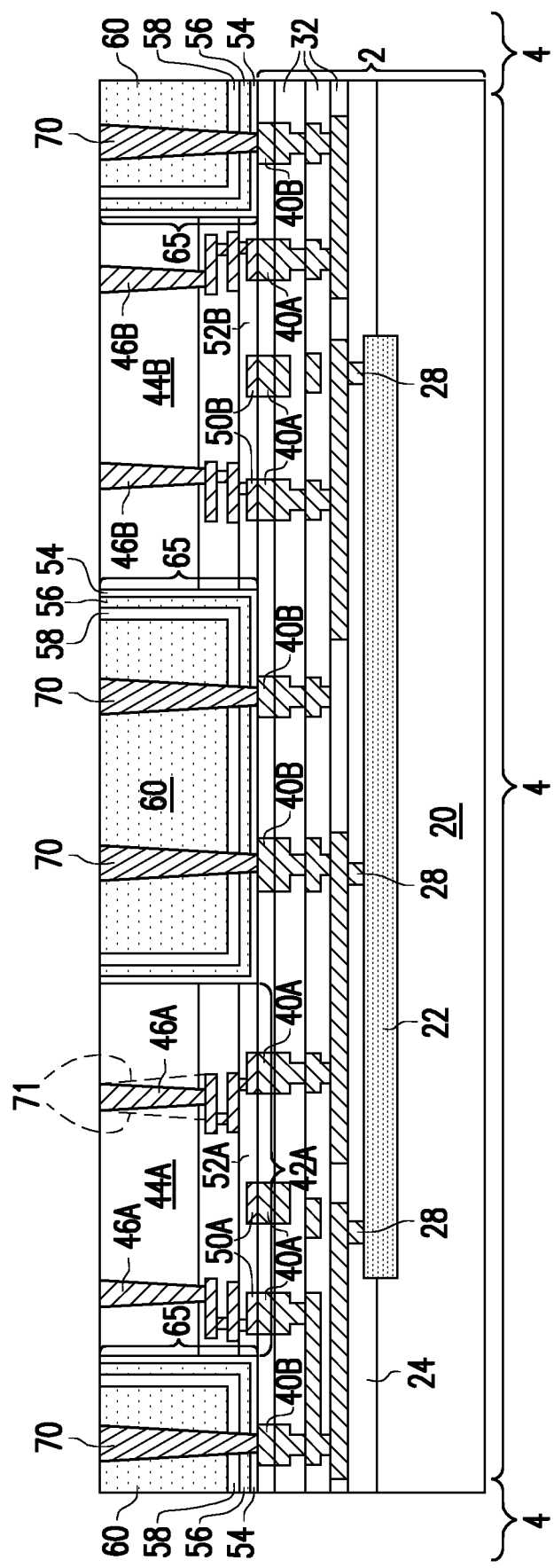

FIG. 9 illustrates the formation of through-vias 70, which fills openings 66 (FIG. 8), and are connected to bond pads 40B. The respective process is illustrated as process 218 in the process flow shown in FIG. 17. In accordance with some embodiments of the present disclosure, the formation of through-vias 70 includes performing a plating process such as an electrical-chemical plating process or an electro-less plating process. Through-vias 70 may include a metallic material such as tungsten, aluminum, copper, or the like. A conductive barrier layer (such as titanium, titanium nitride, tantalum, tantalum nitride, or the like) may also be formed underlying the metallic material. A planarization such as a CMP is performed to remove excess portions of the plated metallic material, and the remaining portions of the metallic material form through-vias 70. Through-vias 70 may have substantially straight and vertical sidewalls. Also, through-vias 70 may have a tapered profile, with top widths slightly greater than the respective bottom widths.

In accordance with alternative embodiments, TSVs 46A and 46B are not pre-formed in device dies 42A and 42B. Rather, they are formed after device dies 42A and 42B are bonded to die 4. For example, either before or after the formation of openings 66 (FIG. 8), device dies 42A and 42B are etched to form additional openings (occupied by the illustrated TSVs 46A and 46B). The additional openings in device dies 42A and 42B and openings 66 may be filled simultaneously to form through TSVs 46A and 46B and through-vias 70. The resulting through-vias 46A and 46B may have upper portions wider than the respective lower portions, as illustrated in FIG. 9. Conversely, in accordance with some embodiments in which TSVs 46A and 46B are pre-formed before bonding, TSVs 46A and 46B may have upper width smaller than the respective bottom widths (as schematically illustrated by dashed lines 71), which are opposite to through-vias 70.

Figure 10:
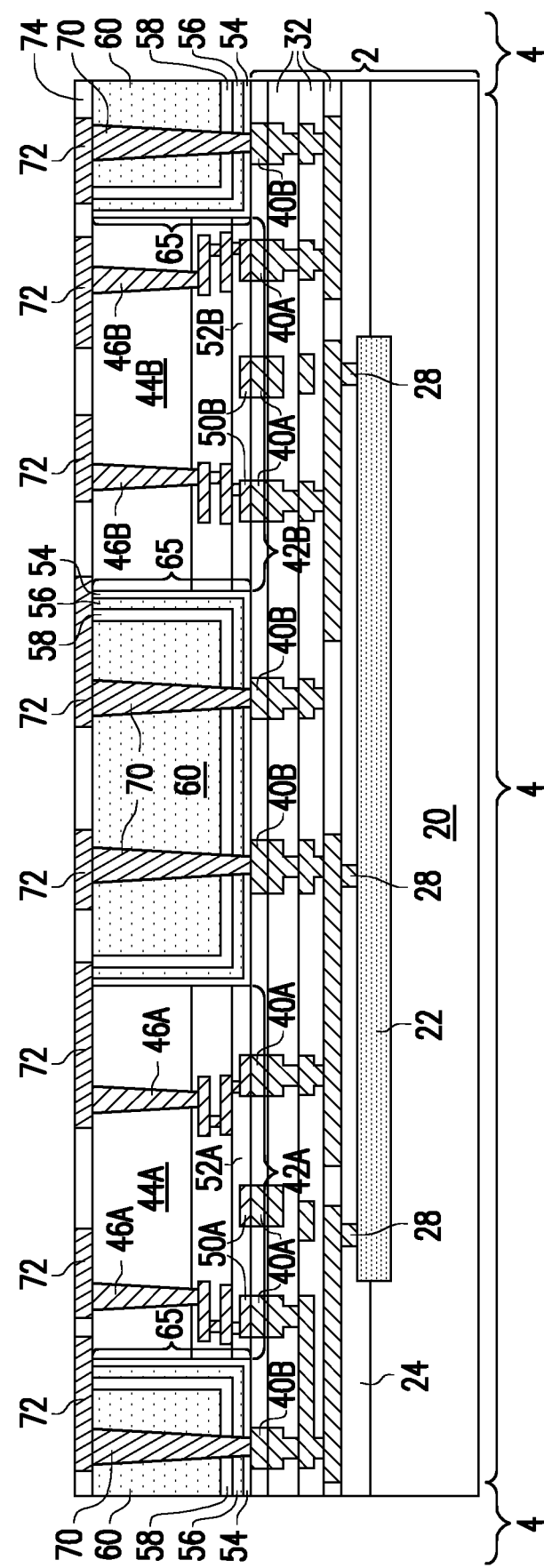

Referring to FIG. 10, redistribution lines (RDLs) 72 and dielectric layer 74 are formed. The respective process is illustrated as process 220 in the process flow shown in FIG. 17. In accordance with some embodiments of the present disclosure, dielectric layer 74 is formed of an oxide such as silicon oxide, a nitride such as silicon nitride, or the like. RDLs 72 may be formed using a damascene process, which includes etching dielectric layer 74 to form openings, depositing a conductive barrier layer into the openings, plating a metallic material such as copper or a copper alloy, and performing a planarization to remove excess portions of RDLs 72.

Figure 11:
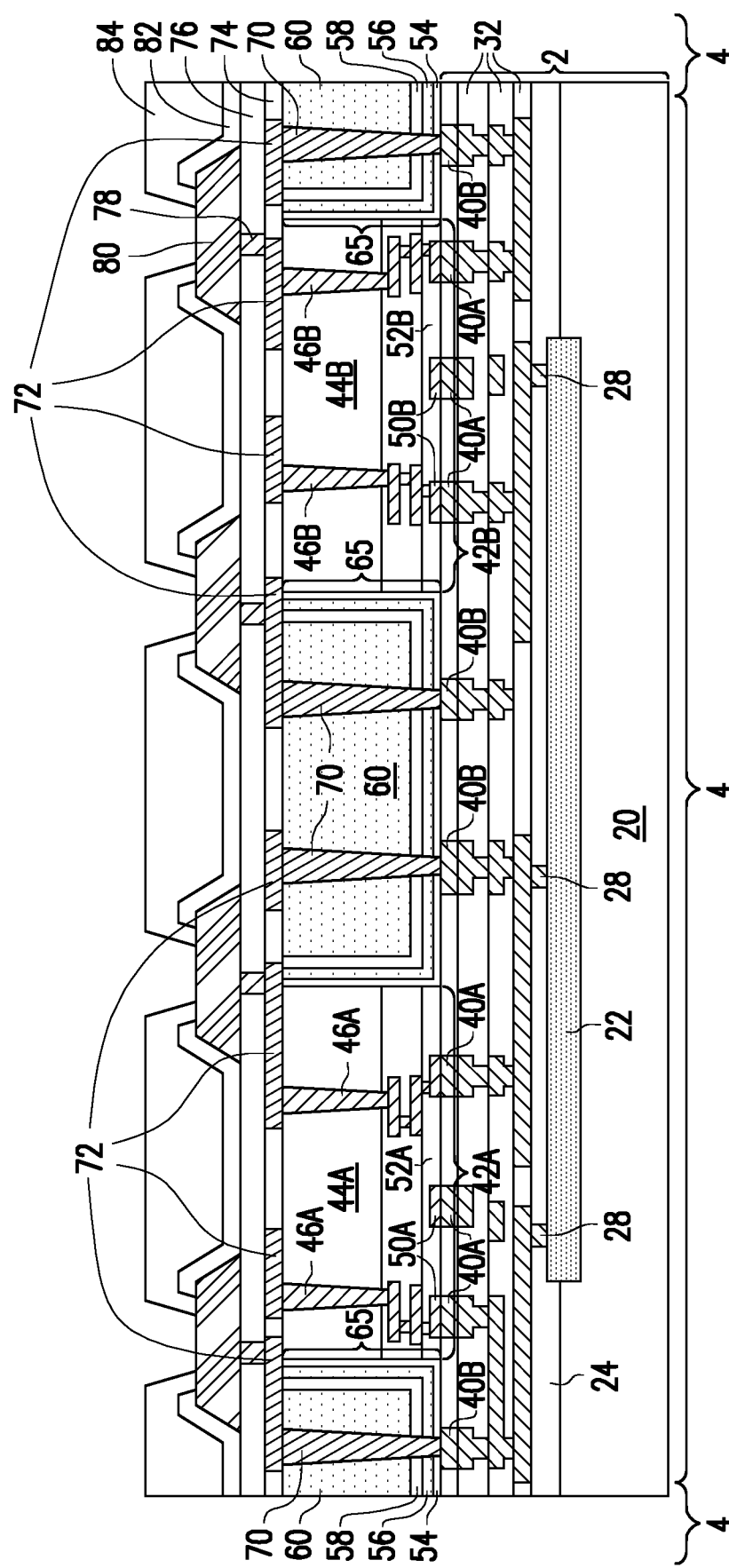

FIG. 11 illustrate the formation of passivation layers, metal pads, and overlying dielectric layers. Passivation layer 76 (sometimes referred to as passivation-1) is formed over dielectric layer 74, and vias 78 are formed in passivation layer 76 to electrically connect to RDLs 72. Metal pads 80 are formed over passivation layer 76, and are electrically coupled to RDLs 72 through vias 78. The respective process is also illustrated as process 220 in the process flow shown in FIG. 17. Metal pads 80 may be aluminum pads or aluminum-copper pads, and other metallic materials may be used.

As also shown in FIG. 11, passivation layer 82 (sometimes referred to as passivation-2) is formed over passivation layer 76. Each of passivation layers 76 and 82 may be a single layer or a composite layer, and may be formed of a non-porous material. In accordance with some embodiments of the present disclosure, one or both of passivation layers 76 and 82 is a composite layer including a silicon oxide layer (not shown separately), and a silicon nitride layer (not shown separately) over the silicon oxide layer. Passivation layers 76 and 82 may also be formed of other non-porous dielectric materials such as Un-doped Silicate Glass (USG), silicon oxynitride, and/or the like.

Next, passivation layer 82 is patterned, so that some portions of passivation layer 82 cover the edge portions of metal pads 80, and some portions of metal pads 80 are exposed through the openings in passivation layer 82. Polymer layer 84 is then formed, and then patterned to expose metal pads 80. Polymer layer 84 may be formed of polyimide, polybenzoxazole (PBO), or the like.

In accordance with some embodiments of the present disclosure, the structure underlying metal pads 80 is free from organic materials (such as polymer layers), so that the process for forming the structures underlying metal pads 80 may adopt the process used for forming device dies, and fine-pitches RDLs (such as 72) having small pitches and line widths are made possible.

Figure 12:
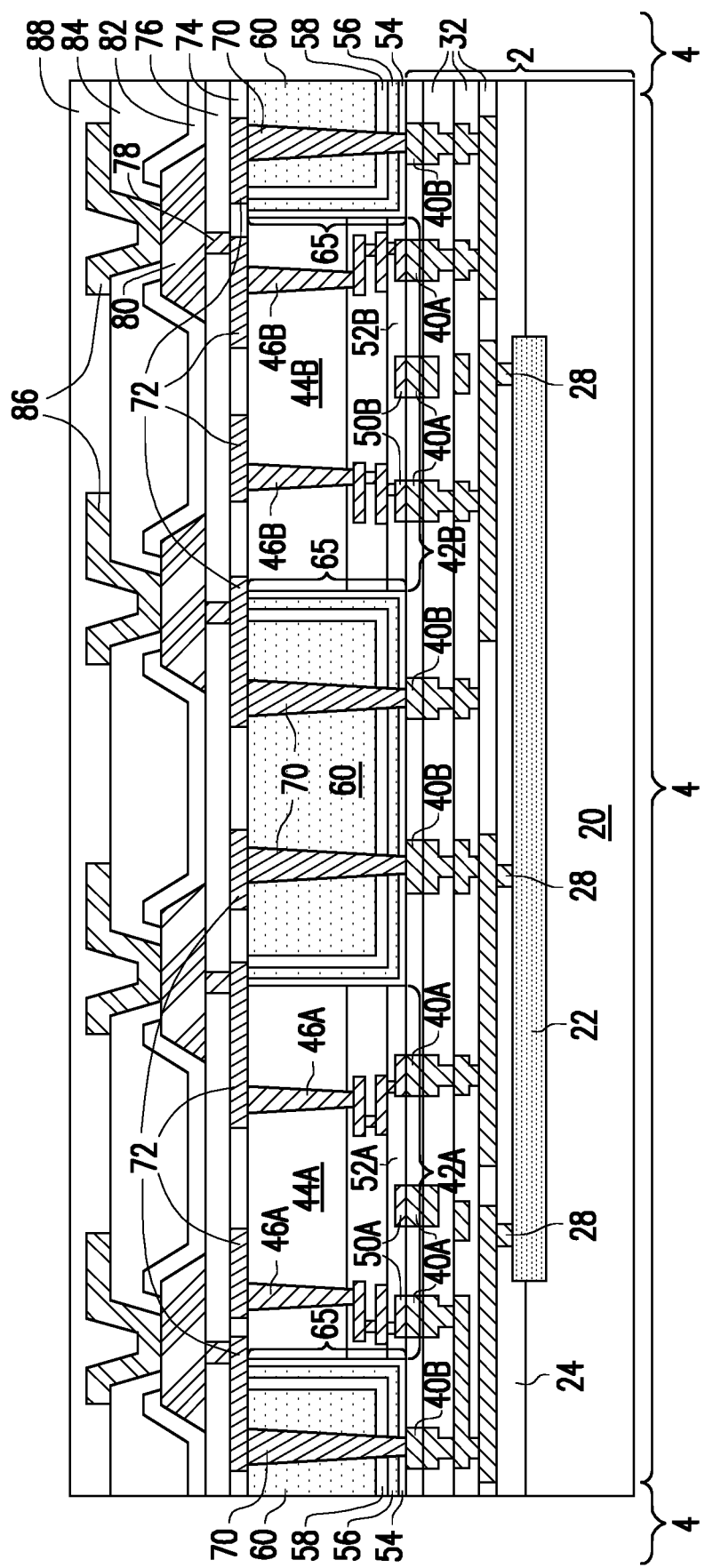

Referring to FIG. 12, Post-Passivation Interconnects (PPI) 86 are formed, which may include forming a metal seed layer and a patterned mask layer (not shown) over the metal seed layer, and plating PPIs 86 in the patterned mask layer. The respective process is also illustrated as process 220 in the process flow shown in FIG. 17. The patterned mask layer and the portions of the metal seed layer overlapped by the patterned mask layer are then removed in etching processes. Polymer layer 88 is then formed, which may be formed of PBO, polyimide, or the like.

Referring to 13, Under-bump metallurgies (UBMs) 90 are formed, and UBMs 90 extend into polymer layer 88 to connect to PPIs 86. The respective process is also illustrated as process 220 in the process flow shown in FIG. 17. In accordance with some embodiments of the present disclosure, each of UBMs 90 includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in UBMs 90.

Figure 13:
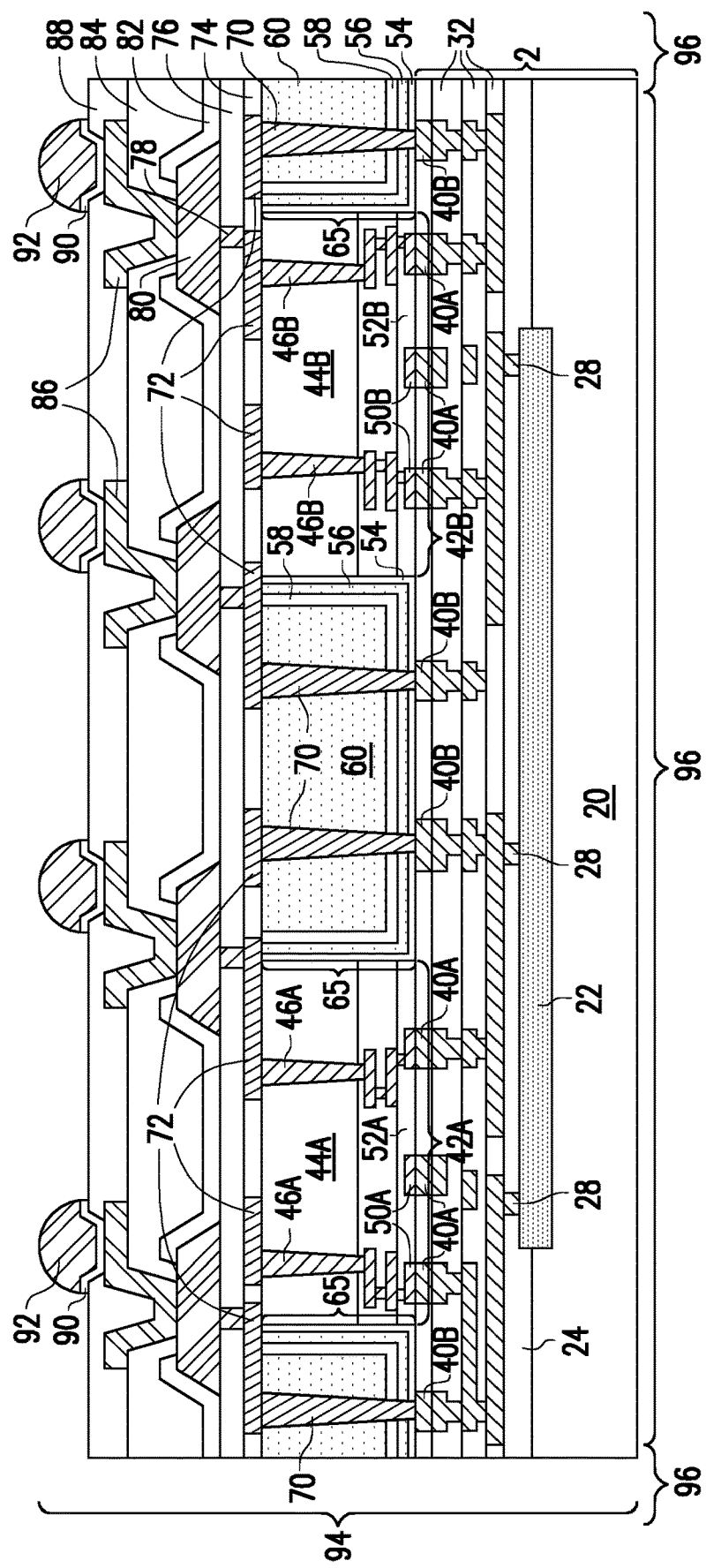

As also shown in FIG. 13, electrical connectors 92 are formed. The respective process is also illustrated as process 220 in the process flow shown in FIG. 17. An exemplary formation process for forming UBMs 90 and electrical connectors 92 includes depositing a blanket UBM layer, forming and patterning a mask (which may be a photo resist, not shown), with portions of the blanket UBM layer being exposed through the opening in the mask. After the formation of UBMs 90, the illustrated package is placed into a plating solution (not shown), and a plating step is performed to form electrical connectors 92 on UBMs 90. In accordance with some exemplary embodiments of the present disclosure, electrical connectors 92 include non-solder parts (not shown), which are not molten in the subsequent reflow processes. The non-solder parts may be formed of copper, and hence are referred to as copper bumps hereinafter, although they may be formed of other non-solder materials. Each of electrical connectors 92 may also include cap layer(s) (not shown) selected from a nickel layer, a nickel alloy, a palladium layer, a gold layer, a silver layer, or multi-layers thereof. The cap layer(s) are formed over the copper bumps. Electrical connectors 92 may further include solder caps, which may be formed of a Sn—Ag alloy, a Sn—Cu alloy, a Sn—Ag—Cu alloy, or the like, and may be lead-free or lead-containing. The structure formed in preceding steps is referred to as composite wafer 94. A die-saw (singulation) step is performed on composite wafer 94 to separate composite wafer 94 into a plurality of packages 96. The respective process is also illustrated as process 222 in the process flow shown in FIG. 17.

Figure 14:
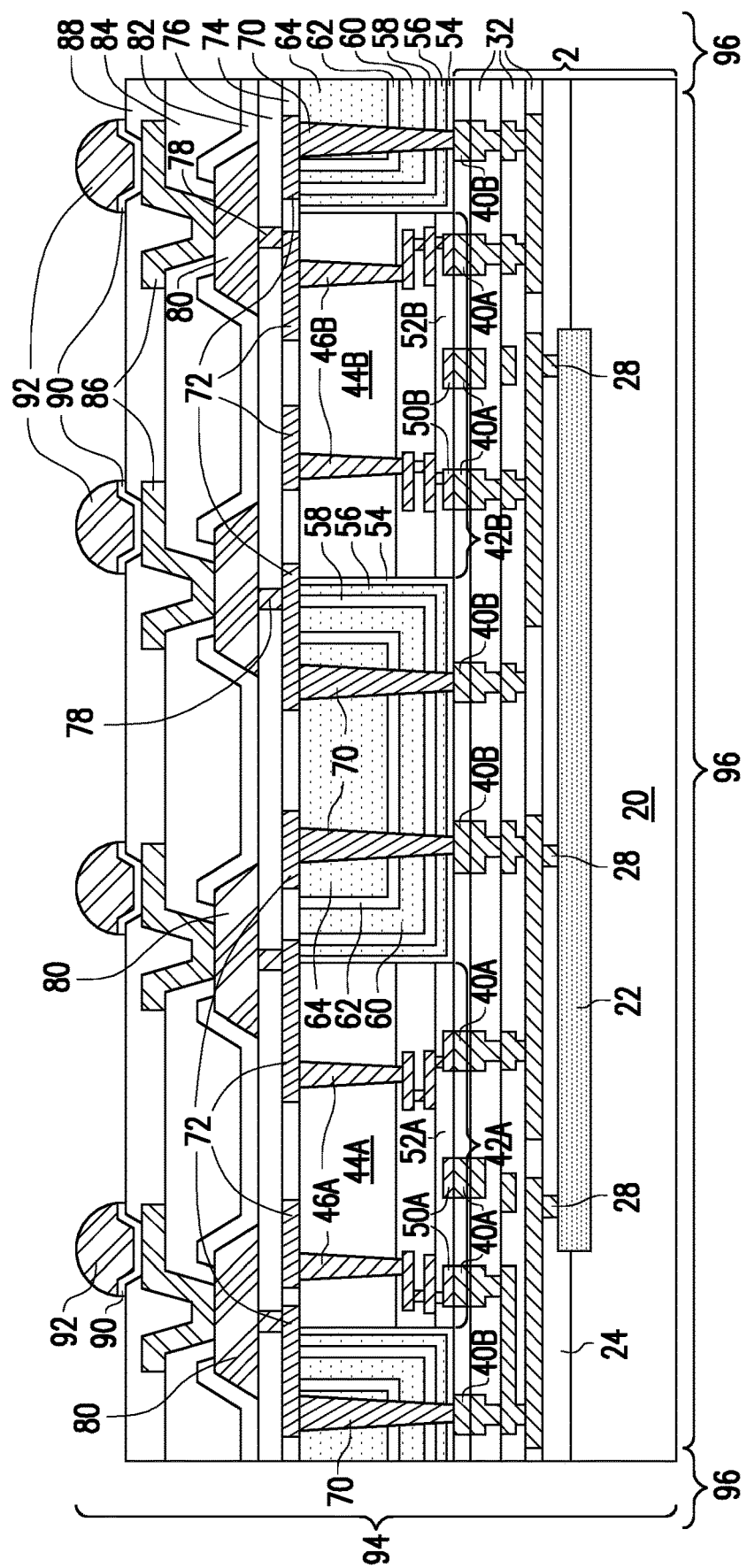
FIG. 14 illustrates a cross-sectional view of a package in accordance with some embodiments.
Figure 15:
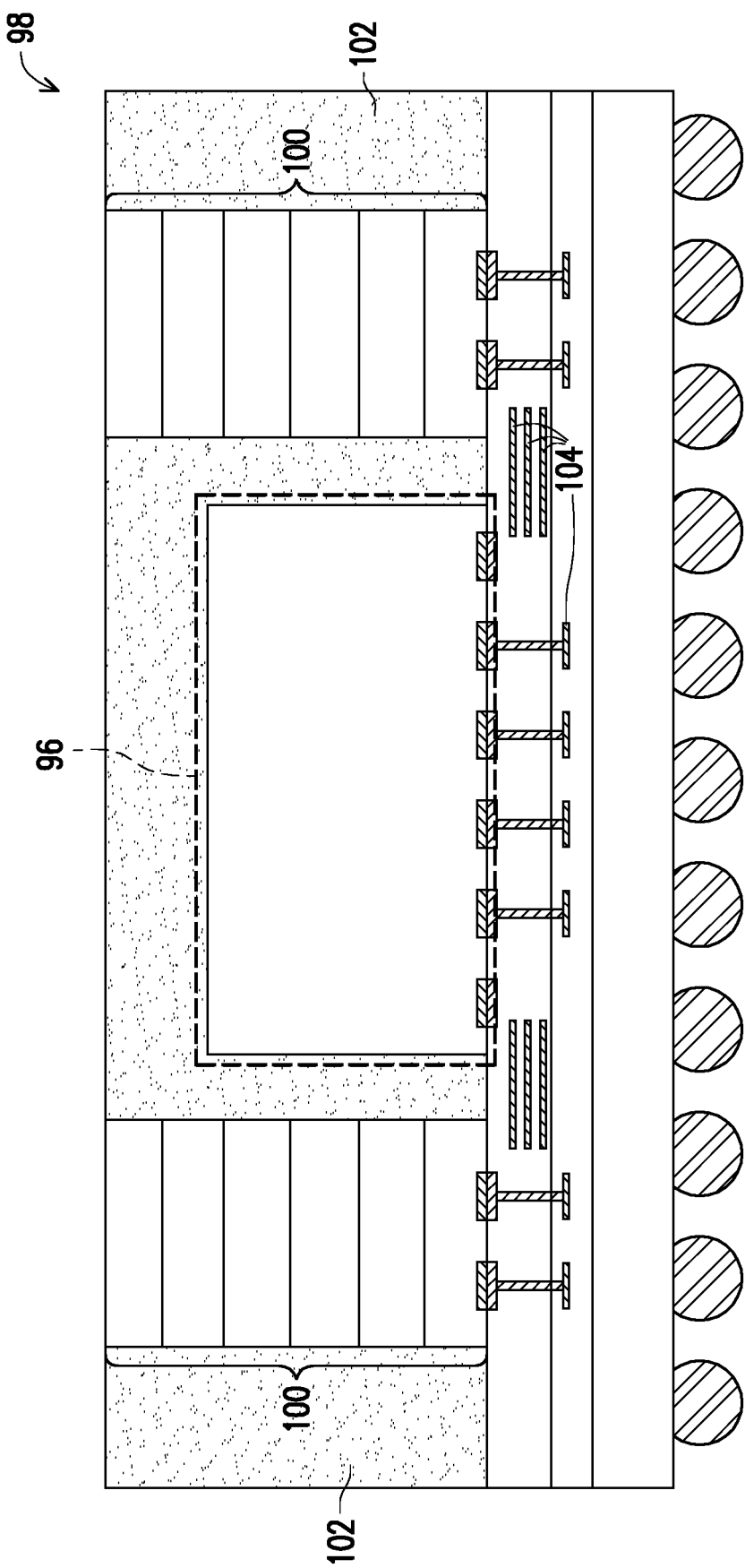
FIGS. 15 and 16 illustrate the cross-sectional views of packages embedding additional package structures in accordance with some embodiments.

FIG. 14 illustrates composite wafer 94 and packages 96 in accordance with alternative embodiments. These embodiments are similar to the embodiments shown in FIG. 13, except that etch stop layer 62 and dielectric layer 64 are further formed. These embodiments are adopted when the thickness of isolation regions 65 are too thick, and two etch stop layers 54 and 58 cannot solve the via-open problem. Etch stop layer 62 may be formed of a material selected from the similar candidate materials for forming etch stop layers 54 and 58. Dielectric layer 64 may be formed of a material selected from the candidate materials for forming dielectric layers 56 and 60. The formation of openings 66 (FIG. 8) thus further includes an addition etching process for etching dielectric layer 64 using etch stop layer 62 for stopping the etching, and etching etch stop layer 62 using dielectric layer 60 for stop the etching. In accordance with some embodiments of the present disclosure, the etching of each of layers 64, 62, 60, 58, and 56 is performed using the respective underlying layer as an etch stop layer. In accordance with alternative embodiments, the etching of each of layers 64 and 62 stops on layers 62 and 60, respectively, while some of the underlying dielectric layers 60 and 56 and the corresponding underlying etch stop layers 58 and 54 may share common processes. For example, layers 60 and 58 may (or may not) share a common etching process using a common etching gas, and the etching may stop on layer 56, which acts as an etch stop layer. Layers 56 and 54 may (or may not) share a common etching process using a common etching gas, and the etching may stop on metal pads 40B, which act as an etch stop layer FIG. 15 illustrates package 98 in which package 96 (FIGS. 13 and 14) is embedded. The package includes memory cubes 100, which include a plurality of stacked memory dies (not shown separately). Package 96 and memory cubes 100 are encapsulated in encapsulating material 102, which may be a molding compound. Dielectric layers and RDLs (collectively illustrated as 104) are underlying and connected to package 96 and memory cubes 100.

Figure 16:
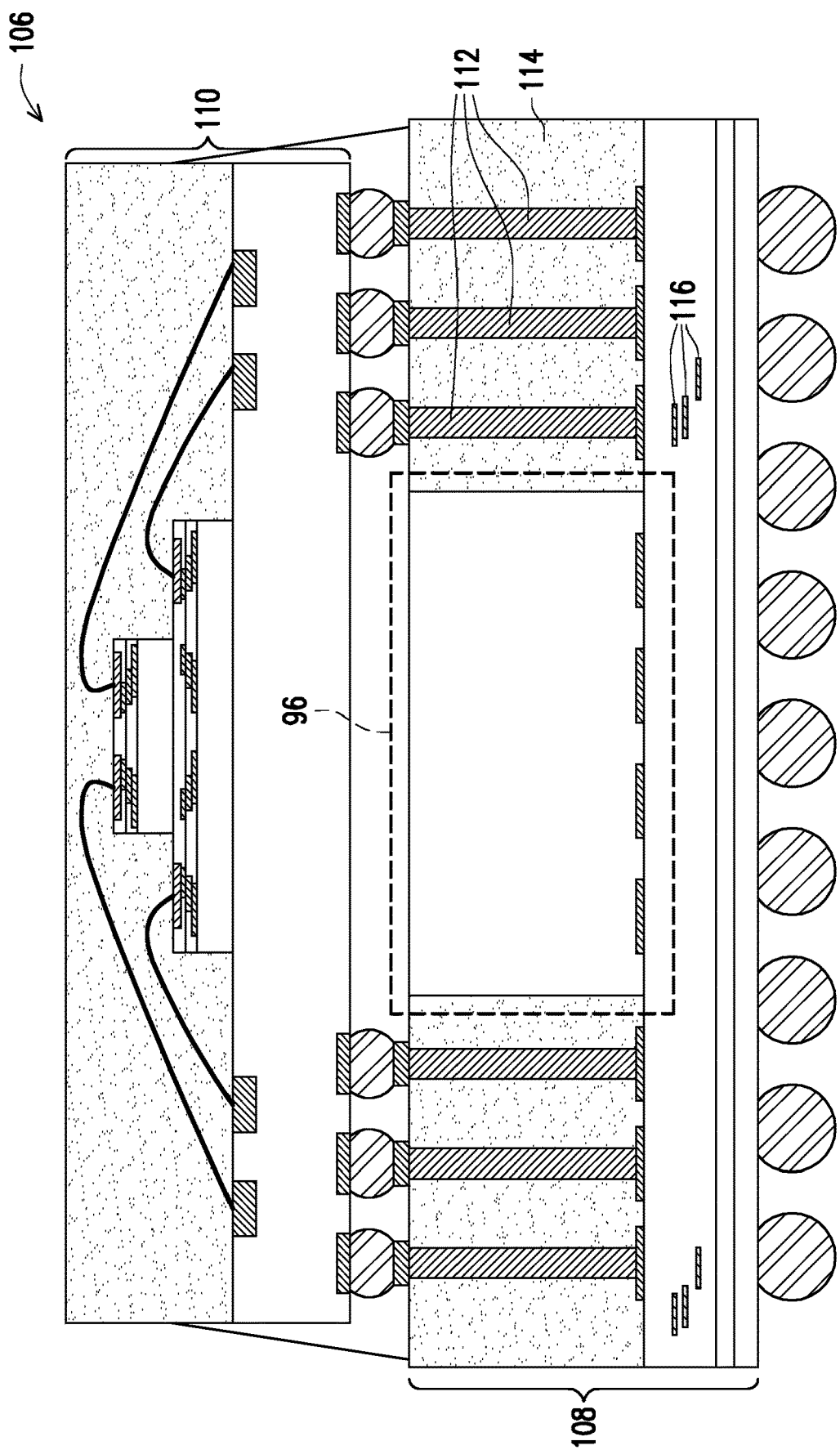

FIG. 16 illustrates Package-on-Package (PoP) structure 106, which has Integrated Fan-Out (InFO) package 108 bonded with top package 110. InFO package 108 also includes package 96 embedded therein. Package 96 and through-vias 112 are encapsulated in encapsulating material 114, which may be a molding compound. Package 96 is bonded to dielectric layers and RDLs, which are collectively referred to as 116.

The embodiments of the present disclosure have some advantageous features. By forming a plurality of etch stop layers, the etching of isolation regions may be synchronized at an intermediate level before the etching process further proceeds. This allows multiple openings on the same wafer to be able to reach the bottom of the isolation regions that have a great thickness/height. The warpage of the wafers thus will not affect the yield of the through-vias in the isolation regions.

In accordance with some embodiments of the present disclosure, a method includes bonding a first and a second device die to a third device die, forming a plurality of gap-filling layers extending between the first and the second device dies, and performing a first etching process to etch a first dielectric layer in the plurality of gap-filling layers to form an opening. A first etch stop layer in the plurality of gap-filling layers is used to stop the first etching process. The opening is then extended through the first etch stop layer. A second etching process is performed to extend the opening through a second dielectric layer underlying the first etch stop layer. The second etching process stops on a second etch stop layer in the plurality of gap-filling layers. The method further includes extending the opening through the second etch stop layer, and filling the opening with a conductive material to form a through-via. In an embodiment, the bonding the first device die and the second device die comprises hybrid bonding. In an embodiment, the second etch stop layer comprises a silicon nitride layer. In an embodiment, the second etch stop layer, the second dielectric layer, and the first etch stop layer are conformal dielectric layers. In an embodiment, the extending the opening through the first etch stop layer comprises etching the first etch stop layer using the second dielectric layer as an etch stop layer. In an embodiment, the method further includes, before the plurality of gap-filling layers is formed, thinning the first device die and the second device die. In an embodiment, the method further includes, before the plurality of gap-filling layers is formed, planarizing the first device die and the second device die to reveal through-vias in the first device die and the second device die. In an embodiment, the first device die, the second device die, the third device die, and the plurality of gap-filling layers are free from organic dielectric materials. In an embodiment, the method further includes forming a redistribution line over the first device die and the second device die, wherein the redistribution line is electrically connected to the through-via.

In accordance with some embodiments of the present disclosure, a method includes bonding a plurality of device dies to a device wafer; forming isolation regions between the plurality of device dies, wherein the forming the isolation regions comprises: forming a first etch stop layer having sidewall portions contacting the plurality of device dies and a bottom portion contacting a top surface of the device wafer; forming a first dielectric layer over the first etch stop layer; forming a second etch stop layer over the first dielectric layer; and forming a second dielectric layer over the second etch stop layer; etching the isolation regions to form a first opening and a second opening penetrating through the isolation regions, wherein bond pads of the device wafer are exposed to the first opening and the second opening, and during the etching the isolation regions, the second etch stop layer is used for stopping the etching; and filling the first opening and the second opening with a conductive material to form a first through-via and a second through-via. In an embodiment, the first etch stop layer, the first dielectric layer, and the second etch stop layer are formed using a conformal deposition method. In an embodiment, the first etch stop layer, the first dielectric layer, and the second etch stop layer are formed using chemical vapor deposition. In an embodiment, the first etch stop layer is formed as being thinner than the second etch stop layer. In an embodiment, the bonding the plurality of device dies to the device wafer comprises hybrid bonding. In an embodiment, the method further includes etching the plurality of device dies to form additional openings; and filling the additional openings to form through-vias to penetrate through semiconductor substrates of the plurality of device dies, wherein the additional openings and the first opening and the second opening are filled simultaneously.

In accordance with some embodiments of the present disclosure, a package includes a first device die; a second device die and a third device die bonded to the first device die; an isolation region between the second device die and the third device die, wherein the isolation region comprises: a first etch stop layer having sidewall portions contacting the first and the second device dies and a bottom portion contacting a top surface of the first device die; a first dielectric layer over the first etch stop layer; a second etch stop layer over the first dielectric layer; and a second dielectric layer over the second etch stop layer; and a through-via penetrating through the isolation region to electrically connect to the first device die. In an embodiment, the through-via penetrates through all dielectric layers in the isolation region. In an embodiment, the through-via is tapered with upper portions increasingly wider than respective lower portions. In an embodiment, the first etch stop layer has a thickness smaller than a thickness of the second etch stop layer. In an embodiment, the first etch stop layer, the first dielectric layer, and the second etch stop layer are conformal layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a first device die;
a second device die and a third device die bonded to the first device die;
an isolation region between the second device die and the third device die, wherein the isolation region comprises:
a first etch stop layer having sidewall portions contacting the second and the third device dies and a bottom portion contacting a top surface of the first device die;
a first dielectric layer over the first etch stop layer;
a second etch stop layer over the first dielectric layer; and
a second dielectric layer over the second etch stop layer; and
a through-via penetrating through the isolation region to electrically connect to the first device die.

2. The package of claim 1, wherein the through-via penetrates through all dielectric layers in the isolation region.

3. The package of claim 1, wherein the through-via is tapered with upper portions increasingly wider than respective lower portions.

4. The package of claim 1, wherein the first etch stop layer has a first thickness smaller than a second thickness of the second etch stop layer.

5. The package of claim 1, wherein the first etch stop layer and the second etch stop layer are formed of a same material.

6. The package of claim 1, wherein each of the first etch stop layer, the first dielectric layer, and the second etch stop layer is a conformal layer.

7. The package of claim 6, wherein the second dielectric layer is a non-conformal layer.

8. The package of claim 1, wherein the first dielectric layer is formed of a material different from materials of the first etch stop layer and the second etch stop layer.

9. The package of claim 8, wherein the second etch stop layer is formed of an additional material different from materials of the first dielectric layer and the second dielectric layer.

10. A package comprising:
a first package component;
a second package component over the first package component; and
an isolation region encircling the second package component, wherein the isolation region comprises:
a first plurality of layers formed of a first material; and
a second plurality of layers formed of a second material different from the first material, wherein each of the second plurality of layers overlaps a corresponding one of the first plurality of layers.

11. The package of claim 10, wherein the first plurality of layers comprise silicon nitride, and the second plurality of layers comprise silicon oxide.

12. The package of claim 10, wherein the isolation region is over, and contacting, the first package component.

13. The package of claim 10 further comprising a through-via penetrating through the first plurality of layers and the second plurality of layers to electrically connect to the first package component.

14. The package of claim 10, wherein the first package component comprises an interposer, and the second package component comprises a device die.

15. The package of claim 10, wherein a bottom layer in the first plurality of layers comprises a horizontal portion in physical contact with a top surface of the first package component, and a vertical portion in physical contact with a sidewall of the second package component.

16. The package of claim 10, wherein the first plurality of layers and the second plurality of layers are allocated alternatingly.

17. A package comprising:
a first package component, wherein the first package component comprises an electrical connector;
a second package component and a third package component over and bonding to the first package component;
an isolation region over the first package component, wherein the isolation region is between the second package component and the third package component, and wherein the isolation region comprises:
a first layer;
a second layer over the first layer; and
a third layer over the second layer, wherein the first layer and the third layer are formed of a same dielectric material; and
a conductive feature penetrating through the isolation region to electrically connect to the electrical connector of the first package component.

18. The package of claim 17, wherein the isolation region further comprises a dielectric region filling rest of a gap between the second package component and the third package component, wherein the dielectric region is directly over a bottom portion of the third layer.

19. The package of claim 17 further comprising a redistribution line over the second package component and the third package component, wherein the redistribution line is electrically connected to the conductive feature.

20. The package of claim 17, wherein the first layer is thinner than the third layer.

\* \* \* \* \*